United States Patent
Numata et al.

(10) Patent No.: US 9,412,455 B2
(45) Date of Patent: Aug. 9, 2016

(54) DATA WRITE CONTROL DEVICE AND DATA STORAGE DEVICE

(71) Applicant: KABUSHIKI KAISHA TOSHIBA, Minato-ku (JP)

(72) Inventors: Makiko Numata, Kamakura (JP); Mitsunori Tadokoro, Fujisawa (JP); Norikazu Yoshida, Kawasaki (JP); Kohei Oikawa, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 251 days.

(21) Appl. No.: 14/176,497

(22) Filed: Feb. 10, 2014

(65) Prior Publication Data

US 2015/0071003 A1    Mar. 12, 2015

Related U.S. Application Data

(60) Provisional application No. 61/876,507, filed on Sep. 11, 2013.

(51) Int. Cl.
| | |
|---|---|
| *G06F 12/00* | (2006.01) |
| *G11C 16/10* | (2006.01) |
| *G06F 12/02* | (2006.01) |
| *G06F 3/06* | (2006.01) |
| *G11C 7/10* | (2006.01) |
| *G06F 13/16* | (2006.01) |

(52) U.S. Cl.
CPC ............. *G11C 16/10* (2013.01); *G06F 3/0679* (2013.01); *G06F 12/0246* (2013.01); *G06F 13/1642* (2013.01); *G06F 13/1673* (2013.01); *G11C 7/1084* (2013.01); *G11C 7/1087* (2013.01)

(58) Field of Classification Search
CPC ............................ G06F 3/0679; G06F 12/0246

USPC ........................................................ 711/112
See application file for complete search history.

(56) References Cited

U.S. PATENT DOCUMENTS

| | | | | | |
|---|---|---|---|---|---|
| 6,092,158 | A * | 7/2000 | Harriman | ............ | G06F 13/1642 710/240 |
| 6,311,256 | B2 * | 10/2001 | Halligan | ....................... | 711/151 |
| 7,574,565 | B2 * | 8/2009 | De Souza | ............ | G06F 12/0866 711/135 |
| 2001/0011323 | A1 * | 8/2001 | Ohta | ....................... | G06F 3/061 711/112 |
| 2007/0220361 | A1 * | 9/2007 | Barnum | .............. | G06F 11/3636 714/45 |
| 2008/0235480 | A1 * | 9/2008 | Traister | ............... | G06F 9/30032 711/167 |
| 2009/0222617 | A1 | 9/2009 | Yano et al. | | |
| 2010/0332456 | A1 * | 12/2010 | Prahlad | ............... | G06F 17/3002 707/664 |
| 2011/0283066 | A1 | 11/2011 | Kurashige | | |

(Continued)

FOREIGN PATENT DOCUMENTS

| | | |
|---|---|---|
| JP | 2009-211222 | 9/2009 |
| JP | 2011-238175 | 11/2011 |

*Primary Examiner* — Prasith Thammavong
(74) *Attorney, Agent, or Firm* — Oblon, McClelland, Maier & Neustadt, L.L.P

(57) ABSTRACT

According to one embodiment, a data transfer control device complying with a communication protocol which executes an update of information from an attachment device in a predetermined area of a system memory, the device includes a receiving part receiving the information from the attachment device, a transferring part transferring the information in the predetermined area, the information from the transferring part overwritten in the predetermined area sequentially, and a determining part inhibiting a transfer of the information in the transferring part to omit the update of the information in the predetermined area.

20 Claims, 11 Drawing Sheets

(56) References Cited

U.S. PATENT DOCUMENTS

| | | |
|---|---|---|
| 2012/0221767 A1 | 8/2012 | Post et al. |
| 2013/0067147 A1* | 3/2013 | Okita ............... G06F 12/0246 711/103 |
| 2013/0145094 A1 | 6/2013 | Kurashige |
| 2013/0318283 A1* | 11/2013 | Small ............... G06F 12/0246 711/103 |
| 2013/0326113 A1* | 12/2013 | Wakrat ............. G06F 12/0868 711/103 |

\* cited by examiner

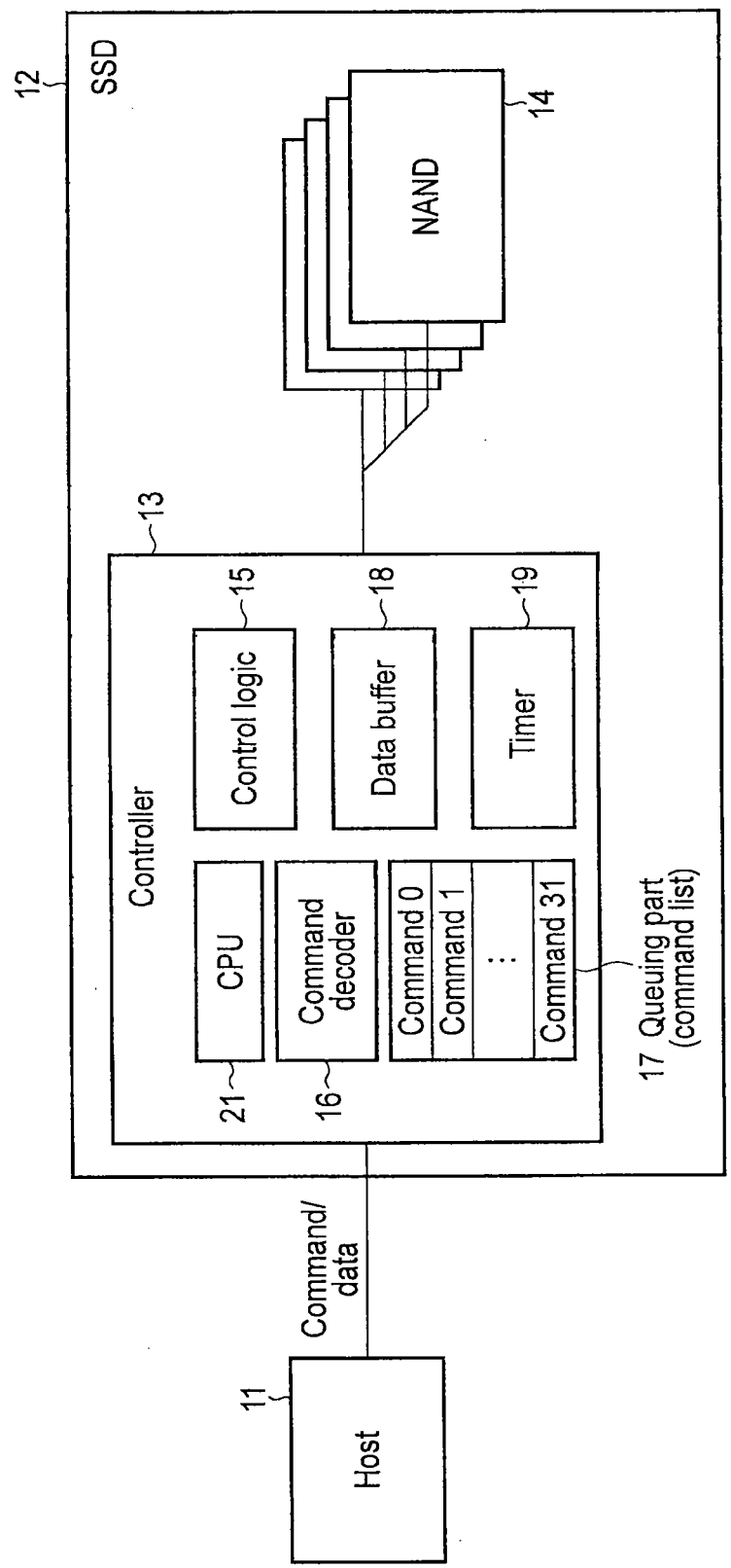
F I G. 1

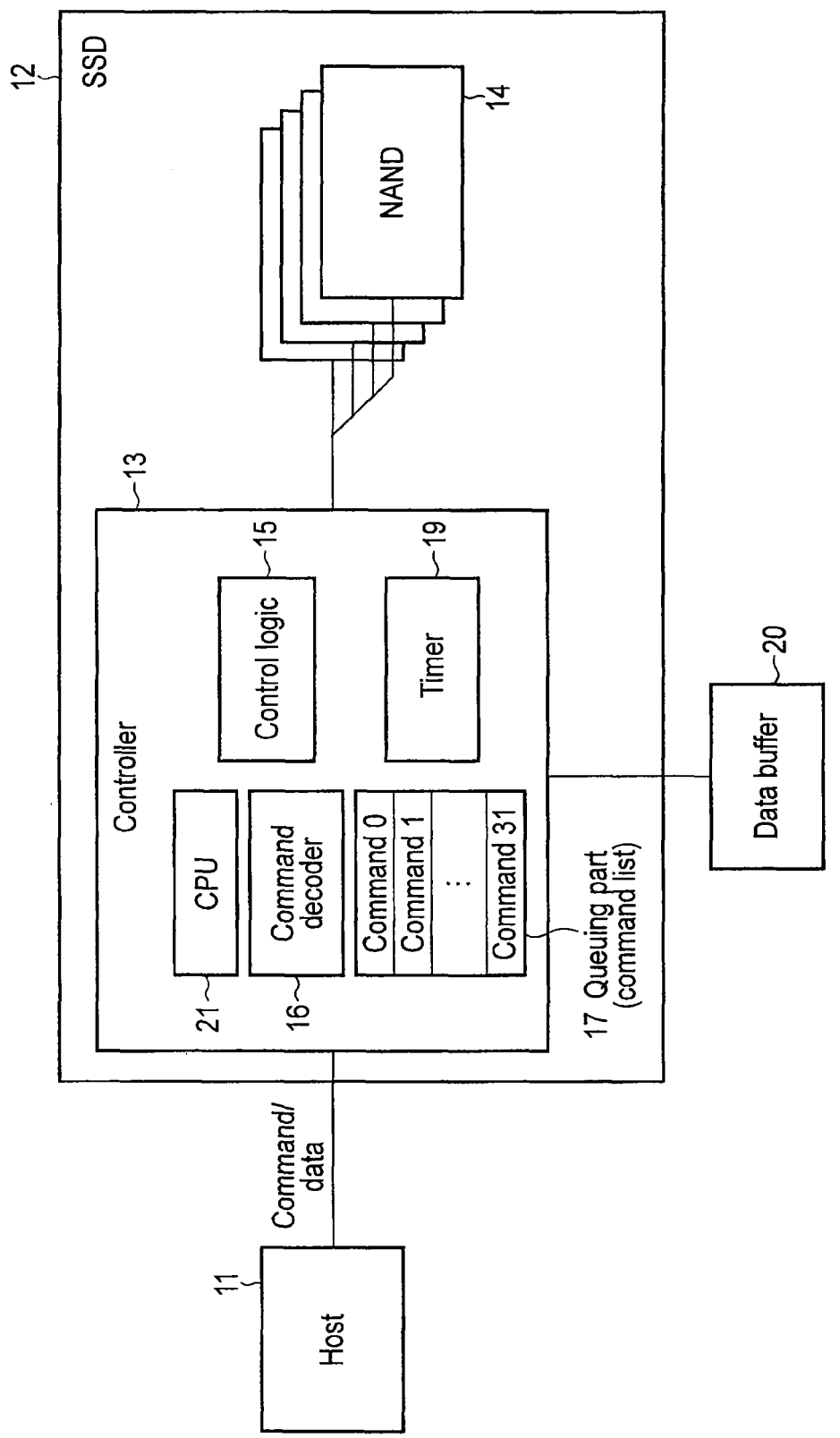
F I G. 2

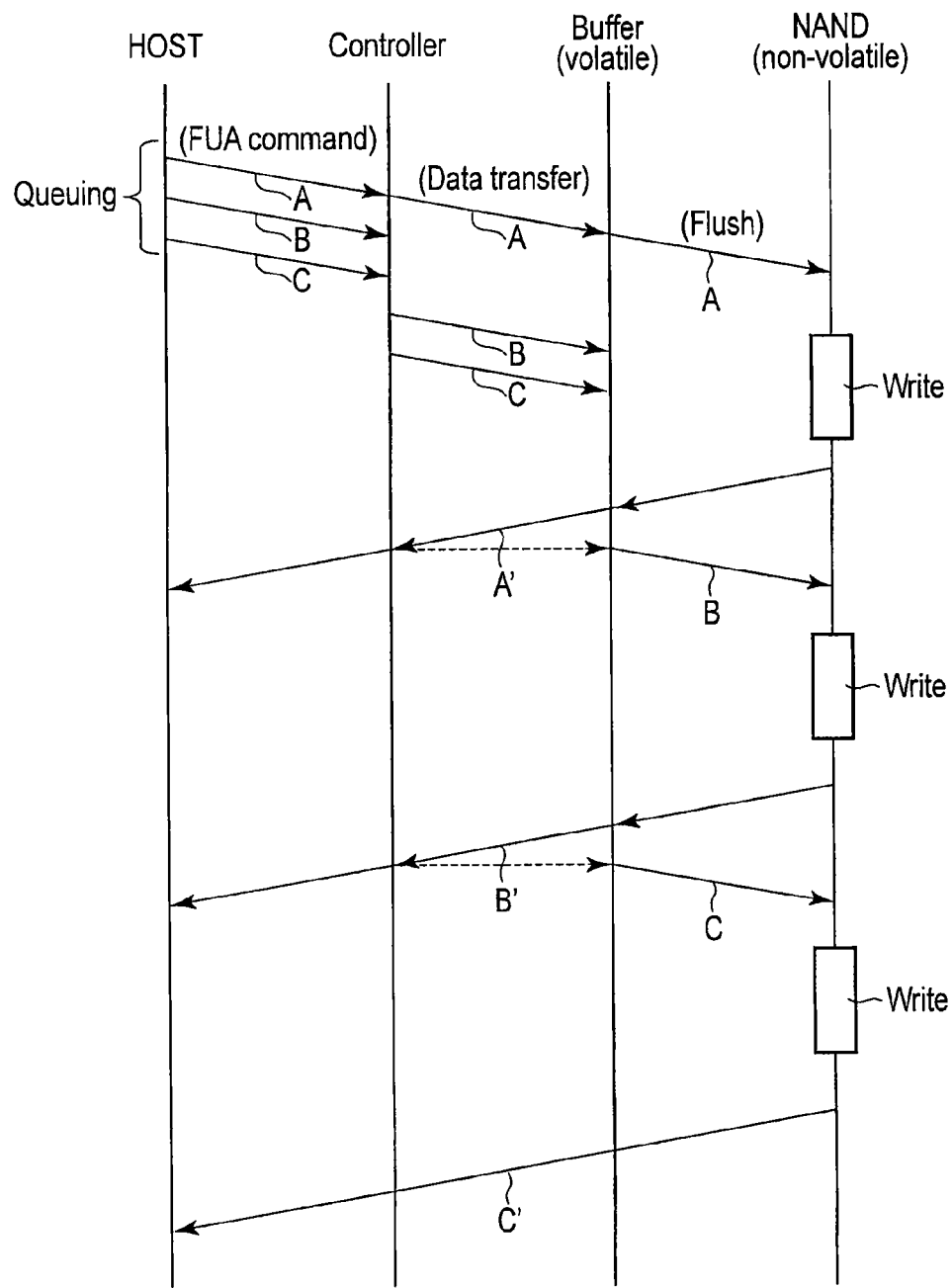
F I G. 4

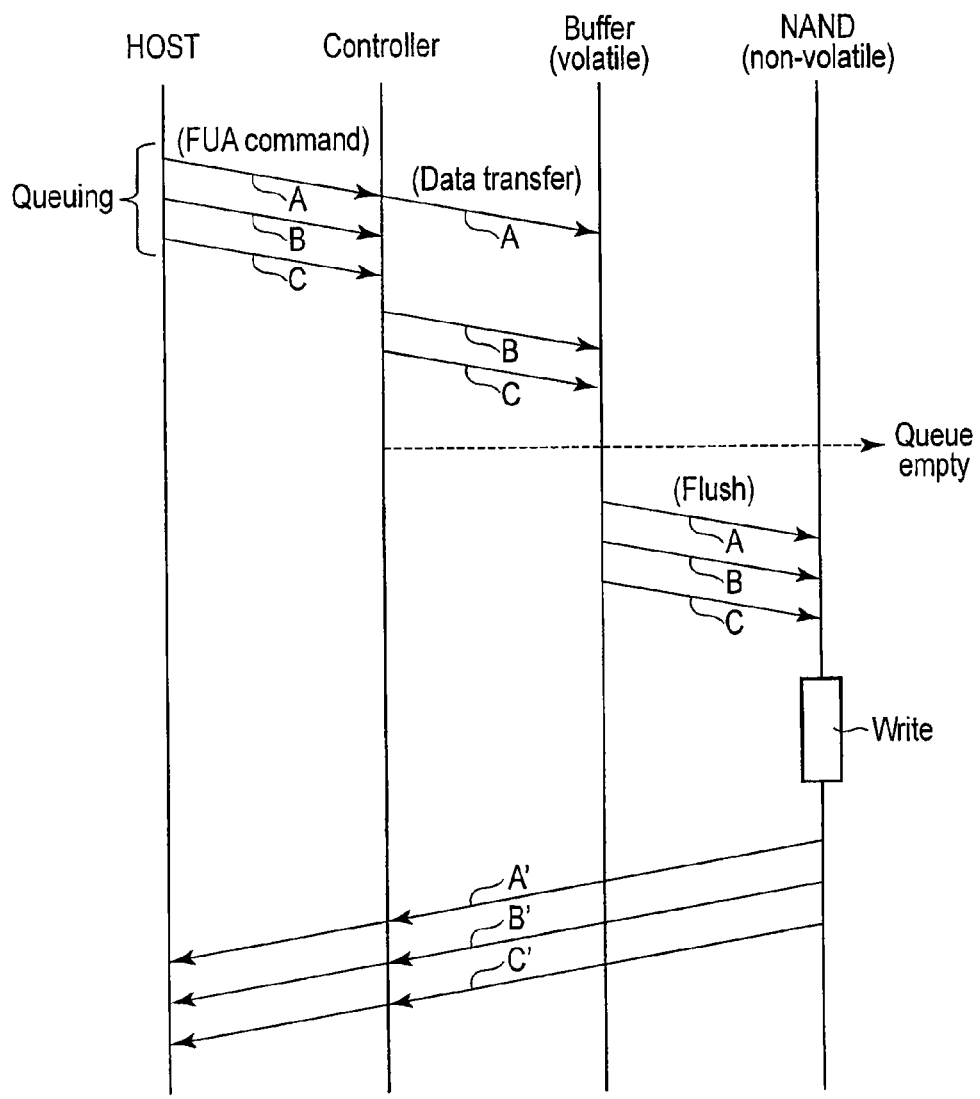
F I G. 6

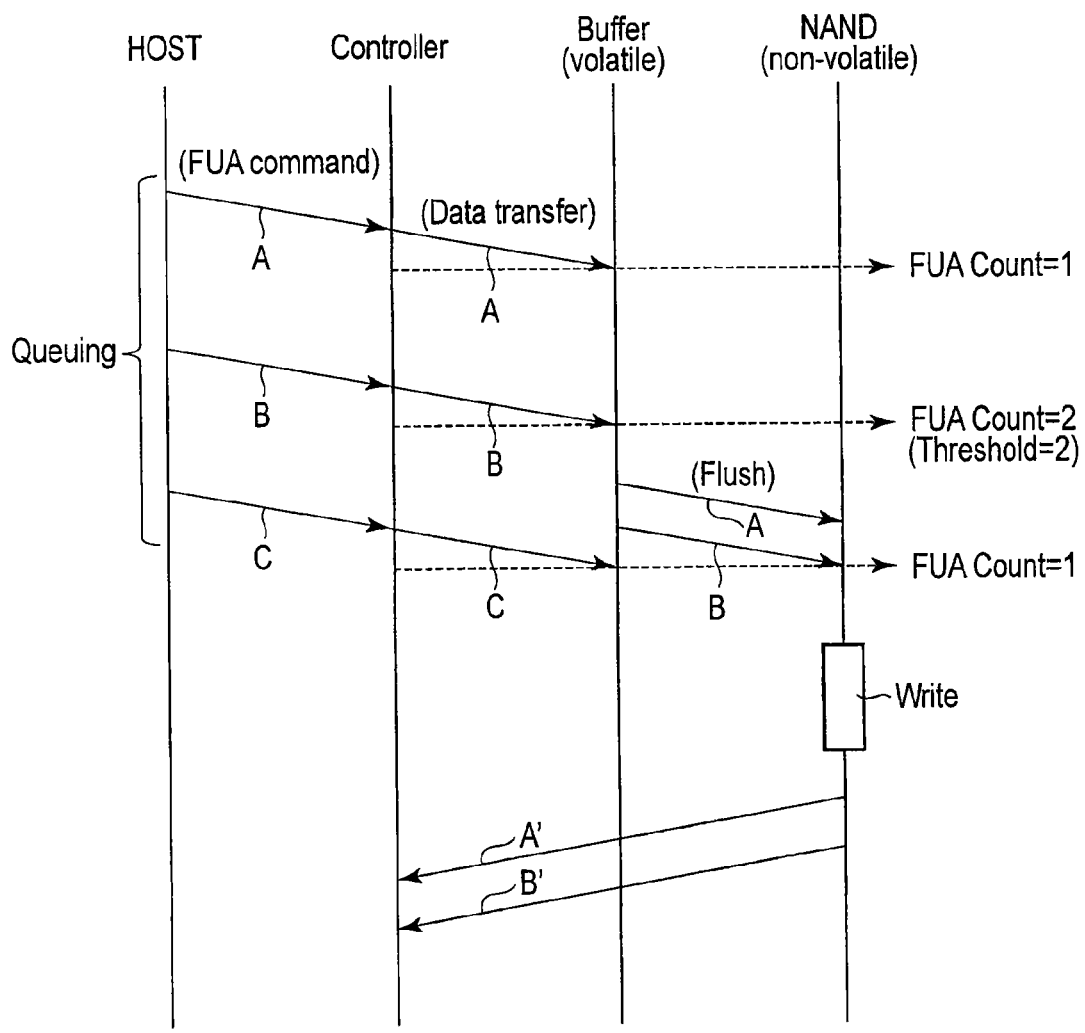
F I G. 9

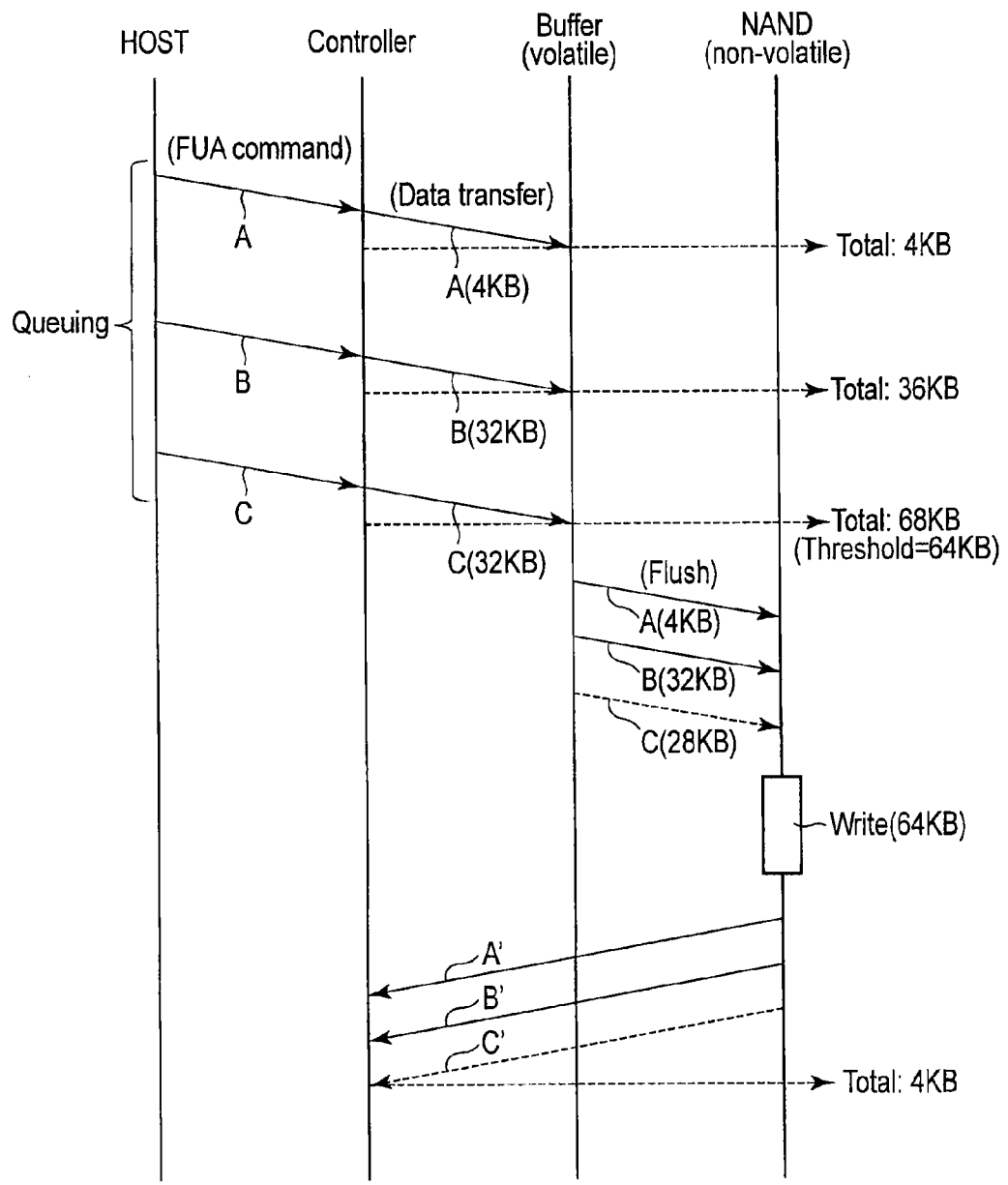
F I G. 11

DATA WRITE CONTROL DEVICE AND DATA STORAGE DEVICE

CROSS-REFERENCE TO RELATED APPLICATIONS

This application claims the benefit of U.S. Provisional Application No. 61/876,507, filed Sep. 11, 2013, the entire contents of which are incorporated herein by reference.

FIELD

Embodiments described herein relate generally to a data write control device and a data storage device.

BACKGROUND

In storage devices that comply with standards, such as ATA (Advanced Technology Attachment) or SCSI (Small Computer System Interface), in general, there is a command called a force unit access (FUA) command that guarantees writing to a nonvolatile memory. Execution of the FUA command is finished when the information indicating completion of writing to the nonvolatile memory is reported from the nonvolatile memory to a controller.

However, where, for example, a plurality of commands are accumulated in a controller independently of data transfer, and are sequentially executed based on their tag numbers (as in Native command Queuing (NCQ) in the SATA (Serial-ATA) standard), if these commands are FUA commands that guarantee writing to a nonvolatile memory, the system may be degraded in performance.

BRIEF DESCRIPTION OF THE DRAWINGS

FIGS. 1 and 2 show system configuration examples;
FIG. 4 shows a data transfer flow as a comparative example;
FIG. 6 shows a data transfer flow according to a first embodiment;
FIG. 9 shows a data transfer flow according to a fourth embodiment;
FIG. 11 shows a data transfer flow according to a sixth embodiment.

DETAILED DESCRIPTION

Figure 3:
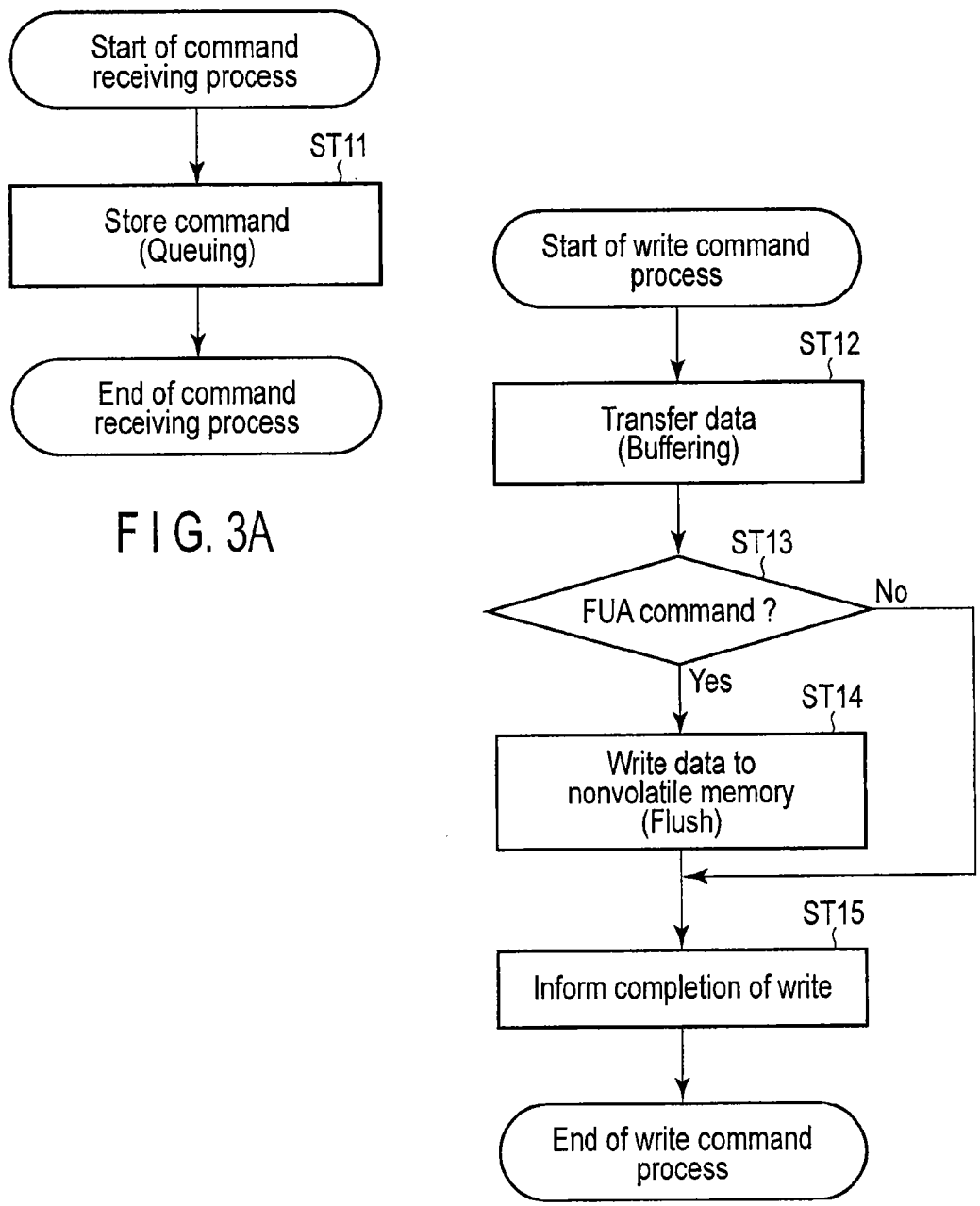
FIGS. 3A and 3B show a write command process as a comparative example.

In general, according to one embodiment, a data write control device comprising: a queuing part which queues commands; and a control part which is configured to: temporarily store data according to commands in a buffer memory, determine whether a predetermined condition is complied, when each of the commands is a command in which a write to a nonvolatile memory is guaranteed, and transfer data according to the commands from the buffer memory to the nonvolatile memory totally, when the predetermined condition is complied.

(Outline)

The embodiments described below relate to enhancement in the efficiency of processing a plurality of queuing commands.

For instance, where data associated with a plurality of commands is temporarily stored in a buffer memory, and these commands are FUA commands that guarantee writing to the nonvolatile memory, it is determined whether a predetermined condition is satisfied, and the data associated with the plurality of commands is simultaneously transferred from the buffer memory to the nonvolatile memory if the predetermined condition is satisfied.

By thus simultaneously writing (flushing) the data associated with the FUA commands to the nonvolatile memory when the predetermined condition is satisfied, the time required for execution of the commands can be shortened to thereby enhance the performance of the entire system.

(System)

FIG. 1 shows a system configuration example.

A memory system (e.g., an SSD) 12 is connectable to a host 11. The system memory 12 comprises a memory controller 13 and a nonvolatile memory (e.g., a NAND flash memory) 14. The memory controller 13 comprises a CPU 21, a control logic 15, a command decoder 16, a queuing part (command list) 17, a data buffer (buffer memory) 18 and a timer 19.

A plurality of commands transferred from the host 11 are registered in the queuing part 17 in the memory controller 13 via the command decoder 16. The data associated with the commands is temporarily stored in the data buffer 18. The data buffer 18 is, for example, a static random access memory (SRAM). The commands registered in the queuing part 17 are sequentially processed based on their tag numbers.

The command logic 15 is a logic circuit configured to execute processing designated by, for example, the CPU 21. The timer 19 measures a period as a determination criterion period for determining whether a predetermined condition is satisfied.

In the embodiment, the data buffer 18 is located in the memory controller (data write control device) 13. The embodiment is not limited to it. For example, shown in FIG. 2, the data buffer 20 may be located outside the memory system 12. In this case, the data buffer 20 is, for example, a dynamic random access memory (DRAM).

Further, it is sufficient if the data buffer 18 is a random access memory faster in operation than the nonvolatile memory 14 as a storage memory. For instance, in FIGS. 1 and 2, the data buffers 18 and 20 may be magnetic random access memories (MRAMs).

(Basic Concept)

FIGS. 3A and 3B show a write command process as a comparative example.

As shown in FIG. 3A, a plurality of commands from a host are registered in the queuing part of the data storage device, independently of a data transfer from the host to the data storage device (step ST11).

Processing (write command process) of a plurality of queuing commands is performed as shown in FIG. 3B.

Firstly, data (write data) associated with a command as an execution target among the plurality of commands is transferred from the host to the data buffer (step ST12).

Subsequently, it is determined whether the command is a FUA command that guarantees writing to the nonvolatile memory (step ST13).

If the command is determined to be a FUA command, data writing from the data buffer to the nonvolatile memory is performed (flushing) (step ST14).

After writing to the nonvolatile memory is completed, information indicating the write completion is sent from the data storage device to the host (step ST15). Namely, writing of data to the nonvolatile memory is guaranteed.

In contrast, if the command is not a FUA command, information indicating the write completion is immediately sent from the data storage device to the host (step ST15). Namely, writing to the nonvolatile memory is not guaranteed.

FIG. 4 shows a data transfer flow as a comparative example.

Firstly, a plurality of commands A, B and C are transferred from the host to the controller. For facilitating the description, it is assumed that the commands A, B and C are all FUA commands. The data associated with the commands A, B and C is temporarily stored in a buffer memory (data transfer).

After that, the data associated with the command A is transferred from the buffer memory to the nonvolatile memory (flushing). After completing the writing to the nonvolatile memory, information indicating that writing of the data associated with the command A has been completed is sent from the controller to the host.

Subsequently, the data associated with the command B is transferred from the buffer memory to the nonvolatile memory (flushing). After completing the writing to the nonvolatile memory, information indicating that writing the data associated with the command B has been completed is sent from the controller to the host.

Lastly, the data associated with the command C is transferred from the buffer memory to the nonvolatile memory (flushing). After completing the writing to the nonvolatile memory, information indicating that writing the data associated with the command C has been completed is sent from the controller to the host.

As described above, in the comparative example, when a plurality of queuing FUA commands are processed, it is necessary to perform, for each FUA command, transfer of data from the buffer memory to the nonvolatile memory, writing of data in the nonvolatile memory, and transfer of the information indicating the completion of writing to the nonvolatile memory.

Since thus, three processes must be performed sequentially, the time required for processing one command is not short. Further, the time required for processing all FUA commands increases in proportion to the number of queuing commands.

Furthermore, since the system cannot determine that processing of all FUA commands has been completed, before wiring of the data associated with all queuing FUA commands to the nonvolatile memory is completed, the storage device is kept busy. Since thus, the busy state of the storage device is kept long, the system is degraded in performance.

To overcome the above, a write command process will be proposed as a basic concept, in which if a plurality of commands are FUA commands that guarantee writing to the nonvolatile memory, it is determined whether a predetermined condition is satisfied, and if this condition is satisfied, data associated with the plurality of commands is simultaneously transferred from the buffer memory to the nonvolatile memory.

Figures 5A, 5B:
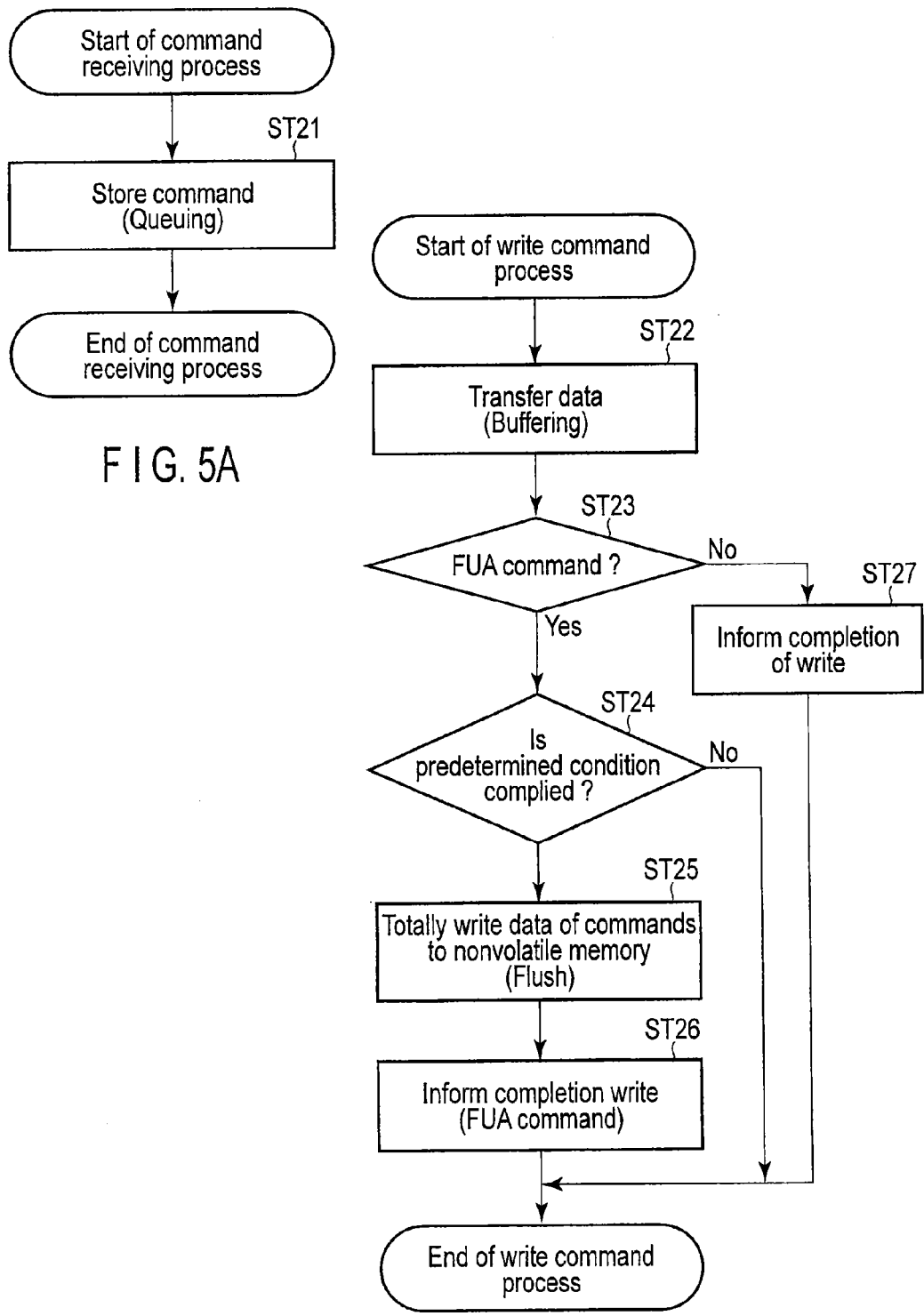
FIGS. 5A and 5B show a write command process as a basic concept.

FIGS. 5A and 5B show the above-mentioned write command process as the basic concept.

As shown in FIG. 5A, a plurality of commands from the host are registered in the queuing part of the data storage device, independently of a transfer of data to the data storage device (step ST21).

The processing (write command process) of a plurality of queuing commands is performed as shown in FIG. 5B.

Firstly, data (write data) associated with one command as an execution target among a plurality of commands is transferred from the host to the data buffer (step ST22).

Subsequently, it is determined whether the command is a FUA command that guarantees data associated therewith to be written to the nonvolatile memory (step ST23).

If the command is determined to be a FUA command, it is further determined whether a predetermined condition is satisfied (step ST24). If the predetermined condition is satisfied, the data associated with the plurality of commands is simultaneously transferred from the data buffer to the nonvolatile memory (flushing) (step ST25).

After completing the writing of data to the nonvolatile memory, information indicating the completion of the writing is sent from the data storage device to the host (step ST26). Namely, writing of data to the nonvolatile memory is guaranteed.

In contrast, if the command is not a FUA command, information indicating the completion of the writing is immediately sent from the data storage device to the host (step ST27). Namely, writing of data to the nonvolatile memory is not guaranteed.

Further, if the predetermined condition is not satisfied, the operation (flushing) of simultaneously transferring data associated with a plurality of commands to the nonvolatile memory is interrupted.

EMBODIMENTS

(1) First Embodiment

FIG. 6 shows a data transfer flow according to a first embodiment.

The first embodiment employs, as the predetermined condition in the basic concept, storing all data associated with a plurality of FUA commands in the buffer memory.

For instance, if the queuing part is empty of FUA commands, the controller determines that data associated with a plurality of FUA commands is all stored in the buffer memory. After that, the controller simultaneously transfers the data associated with the plurality of FUA commands from the buffer memory to the nonvolatile memory.

Until the data associated with the plurality of FUA commands is stored in the buffer memory, i.e., until the final command is processed, writing, to the nonvolatile memory, of the data already stored in the buffer memory during the processing of the commands other than the final one is interrupted.

Firstly, a plurality of commands A, B and C are transferred from the host to the controller. For facilitating the description, it is assumed that the commands A, B and C are all FUA commands. The data associated with the commands A, B and C is temporarily stored in the buffer memory (data transfer).

Regarding the two commands A and B, data writing to the nonvolatile memory is interrupted when data writing to the buffer memory (buffering) has finished. When writing of data associated with the final command C to the buffer memory has finished, the queuing part becomes empty of FUA commands.

In this state, the controller determines that the command C included in the queuing FUA commands is the final FUA command, i.e., determines that the data associated with the commands A, B and C has been all stored in the buffer memory.

Accordingly, the data associated with the commands A, B and C is simultaneously transferred from the buffer memory to the nonvolatile memory (flushing).

Further, after completing the writing of the data associated with the commands A, B and C to the nonvolatile memory, information items A', B' and C' indicating the completion of writing of the data associated with the commands A, B and C are simultaneously sent from the controller to the host.

As described above, in the first embodiment, when a plurality of queuing FUA commands are processed, the data associated with the FUA commands is simultaneously transferred to the nonvolatile memory on condition that the data associated with the FUA commands is already stored in the buffer memory.

Since in this case, the data associated with a plurality of FUA commands can be simultaneously written, the storage device can assume a busy state at a time, unlike the comparative example. Accordingly, the time required for processing all FUA commands can be shortened, compared to the comparative example. Namely, the busy state of the storage device can be shortened to thereby enhance the performance of the system.

In the first embodiment, the commands transferred from the host to the controller may include non-FUA commands that do not guarantee writing to the nonvolatile memory. In this case, the controller has a function of selecting FUA commands from queuing commands.

(2) Second Embodiment

Figure 7:
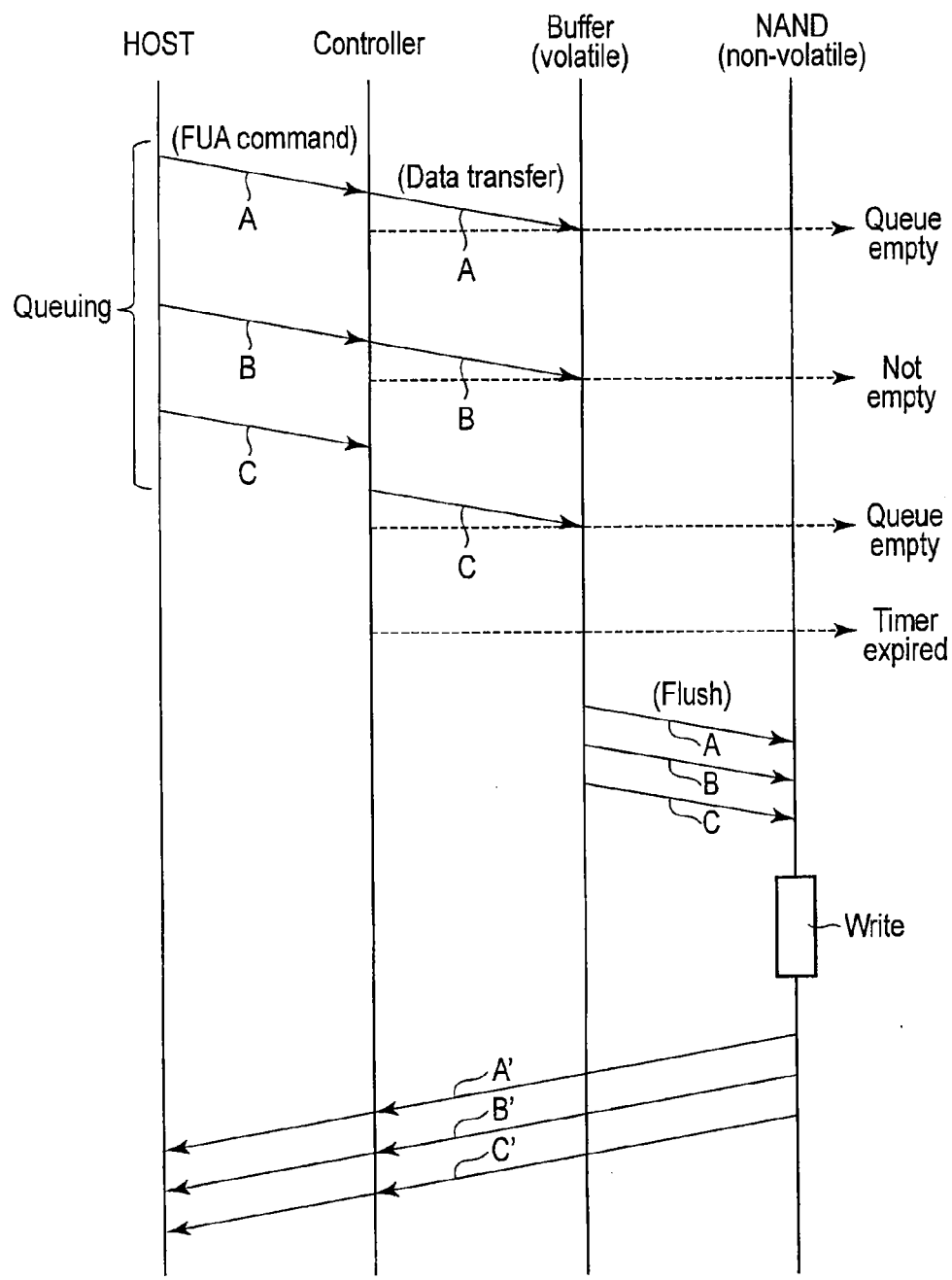
FIG. 7 shows a data transfer flow according to a second embodiment.

FIG. 7 shows a data transfer flow according to a second embodiment.

In the second embodiment, a feature that no FUA commands are queued in the queuing part for a predetermined period after the queuing part becomes empty of FUA commands is employed as the predetermined condition in the basic concept.

For instance, if the issue interval between FUA commands issued by the host is long, and if writing of data to the nonvolatile memory starts immediately after the queuing part becomes empty of FUA commands as in the first embodiment, writing of data to the nonvolatile memory may start before all commands from the host are queued.

To avoid this, the second embodiment is constructed such that even if the queuing part becomes empty of FUA commands, data writing to the nonvolatile memory is interrupted for a predetermined period after the empty state is assumed.

If no new FUA commands are queued in the queuing part for the predetermined period, the controller determines that all data associated with the FUA commands to be executed has been stored in the buffer memory, and therefore simultaneously transfers the data associated with the FUA commands from the buffer memory to the nonvolatile memory.

Specifically, firstly, a plurality of commands A, B and C are transferred from the host to the controller. For facilitating the description, it is assumed that the commands A, B and C are all FUA commands. The data associated with the commands A, B and C is temporarily stored in a buffer memory (data transfer).

Regarding the two commands A and B, data writing to the nonvolatile memory is interrupted when data writing to the buffer memory (buffering) has finished, since the command C remains in the queuing part. When writing of the data associated with the final command C to the buffer memory has finished, the queuing part becomes empty of FUA commands.

If no new FUA commands are queued in the queuing part for a predetermined period after the final command C is processed, the controller determines that the command C is the final one of the queued FUA commands, i.e., that all data associated with the commands A, B and C have been stored in the buffer memory.

Consequently, the data associated with the commands A, B and C is simultaneously transferred from the buffer memory to the nonvolatile memory (flushing).

The above-mentioned predetermined period is measured by a timer.

Further, after completing the writing of the data associated with the plurality of commands A, B and C to the nonvolatile memory, information items A', B' and C' indicating the completion of writing of the data associated with the commands A, B and C are simultaneously sent from the controller to the host.

As described above, in the second embodiment, when a plurality of queuing FUA commands are processed, the data associated with the FUA commands is simultaneously transferred to the nonvolatile memory a predetermined period after the queuing part becomes empty of FUA commands, on condition that no new FUA commands are issued for the predetermined period.

Since in this case, the data associated with a plurality of FUA commands can be simultaneously written, the storage device can assume a busy state at a time, unlike the comparative example. Accordingly, the time required for processing all FUA commands can be shortened, compared to the comparative example. Namely, the busy state of the storage device can be shortened to thereby enhance the performance of the system.

In the second embodiment, the commands transferred from the host to the controller may include non-FUA commands that do not guarantee writing to the nonvolatile memory. In this case, the controller has a function of selecting FUA commands from queuing commands.

Further, the second embodiment is advantageous to the case where the number of queuing FUA commands is small. Namely, where both FUA commands and non-FUA commands are queued in the queuing part, if the number of queuing FUA commands is small, the issue interval of the FUA commands is supposed to be long. Even in this case, the second embodiment can reliably detect the final FUA command.

(3) Third Embodiment

Figure 8:
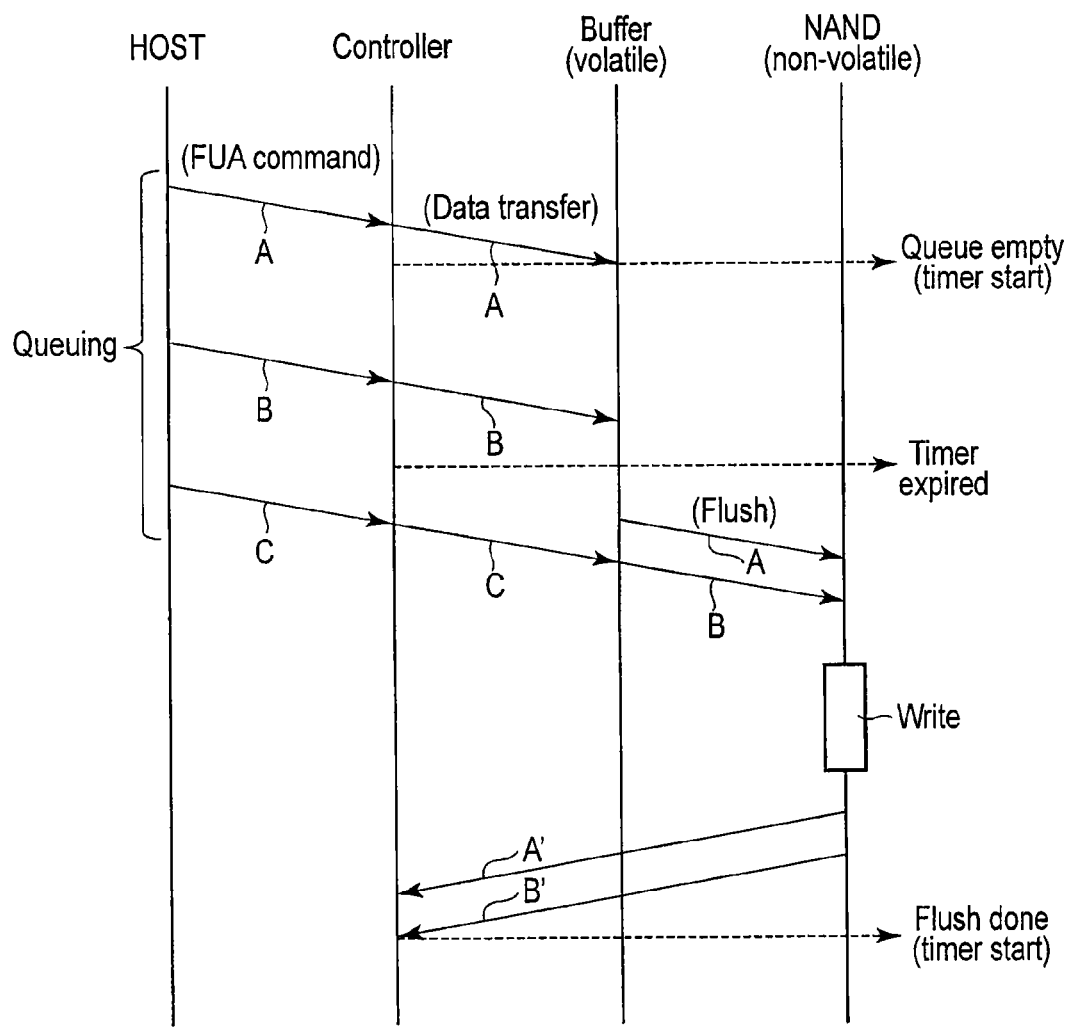
FIG. 8 shows a data transfer flow according to a third embodiment.

FIG. 8 shows a data transfer flow according to a third embodiment.

The third embodiment is characterized in that a feature that a predetermined period elapses after the queuing part becomes empty of FUA commands is employed as the predetermined condition in the basic concept.

FUA commands guarantee writing to the nonvolatile memory. Accordingly, if the data size of batch writing to the nonvolatile memory is large in the second embodiment, and if an error (such as reduction of a power supply voltage due to power failure) has occurred during the batch writing, a lot of time is required for emergency data saving.

Therefore, to reliably perform emergency data saving, a sufficient battery capacity must be secured.

In light of this, in the third embodiment, writing to the nonvolatile memory is interrupted until a predetermined period elapses after the queuing part is empty of FUA commands, and batch writing to the nonvolatile memory is performed after the predetermined period elapses.

By thus regularly performing writing to the nonvolatile memory, the data size of batch writing is prevented from being excessively increased, thereby reducing the time required for emergency data saving upon occurrence of an error, and reducing the required battery capacity.

Specifically, firstly, a plurality of commands A, B and C are transferred from the host to the controller. For facilitating the description, it is assumed that the commands A, B and C are all FUA commands. The data associated with the commands A, B and C is temporarily stored in a buffer memory (data transfer).

Assume here that when the first command A has been written to the buffer memory (buffering), the queuing part becomes empty of FUA commands. In this case, a predetermined period elapsing from the time when the queuing part becomes empty of FUA commands is measured by a timer.

Also assume that writing (buffering) of the data associated with the next command B is completed within the predetermined period.

In this case, after the predetermined period elapses from the time when the queuing part becomes empty of FUA commands, the data associated with the commands A and B is simultaneously transferred from the buffer memory to the nonvolatile memory (flushing).

Further, after the writing of the data associated with the plurality of commands A and B to the nonvolatile memory is completed, information items A' and B' indicating the completion of writing of the data associated with the commands A and B are simultaneously sent from the controller to the host.

Thus, in the third embodiment, when a plurality of queuing FUA commands are processed, the data associated with the FUA commands are simultaneously transferred to the nonvolatile memory on condition that a predetermined period has elapsed after the queuing part becomes empty of FUA commands.

In this case, since the data associated with FUA commands can be simultaneously transferred, the storage device can assume a busy state at a time, unlike the comparative example. Accordingly, the time required for processing all FUA commands can be shortened, compared to the comparative example. Namely, the busy state of the storage device can be shortened to thereby enhance the performance of the system.

In the third embodiment, the commands transferred from the host to the controller may include non-FUA commands that do not guarantee writing to the nonvolatile memory. In this case, the controller has a function of selecting FUA commands from queuing commands.

Further, although in the third embodiment, the aforementioned predetermined period starts from the time when the queuing part becomes empty of FUA commands. The embodiment is not limited to it. For example, it may starts from the time when a FUA command is received (or is registered in the queuing part), or when transfer of the data associated with FUA commands is completed.

(4) Fourth Embodiment

FIG. 9 shows a data transfer flow according to a fourth embodiment.

The fourth embodiment employs, as the predetermined condition in the basic concept, a feature that the number of FUA commands in the queuing part exceeds a threshold.

Like the third embodiment, the fourth embodiment can also overcome the problem that a lot of time is required for emergency data saving when an error (such as reduction of a power supply voltage due to power failure) has occurred during batch writing to the nonvolatile memory.

In the fourth embodiment, if the number of FUA commands does not reach a threshold, writing to the nonvolatile memory is interrupted, while when the number of FUA commands reaches the threshold, batch writing to the nonvolatile memory is performed.

As described above, by regularly performing writing to the nonvolatile memory, the data size of batch writing can be prevented from being excessively increased, thereby reducing the time required for emergency data saving upon occurrence of an error, and reducing the required battery capacity.

Specifically, firstly, a plurality of commands A, B and C are transferred from the host to the controller. For facilitating the description, it is assumed that the commands A, B and C are all FUA commands. The data associated with the commands A, B and C is temporarily stored in a buffer memory (data transfer).

When writing of the data associated with the first command A to the buffer memory (buffering) has finished, the value of a counter is set to, for example, 1 (count=1). Further, when writing of the data associated with the subsequent command B to the buffer memory has finished, the value of the counter is set to, for example, 2 (count=2).

In the fourth embodiment, the threshold is set to 2.

In this case, after finishing the writing of the data associated with the command B to the buffer memory, the data associated with the commands A and B is simultaneously transferred from the buffer memory to the nonvolatile memory (flushing).

After completing the writing of the data associated with the commands A and B to the nonvolatile memory, information items A' and B' indicating that writing the data associated with the commands A and B is completed are simultaneously sent from the controller to the host.

As described above, in the fourth embodiment, when a plurality of queuing FUA commands are processed, the data associated with the FUA commands is simultaneously transferred to the nonvolatile memory on condition that the number of the FUA commands reaches the threshold.

Since in this case, the data associated with the FUA commands can be simultaneously written, the storage device can assume a busy state at a time, unlike the comparative example. Accordingly, the time required for processing all FUA commands can be shortened, compared to the comparative example. Namely, the busy state of the storage device can be shortened to thereby enhance the performance of the system.

In the fourth embodiment, the commands transferred from the host to the controller may include non-FUA commands that do not guarantee writing to the nonvolatile memory. In this case, the controller has a function of selecting FUA commands from queuing commands.

(5) Fifth Embodiment

Figure 10:
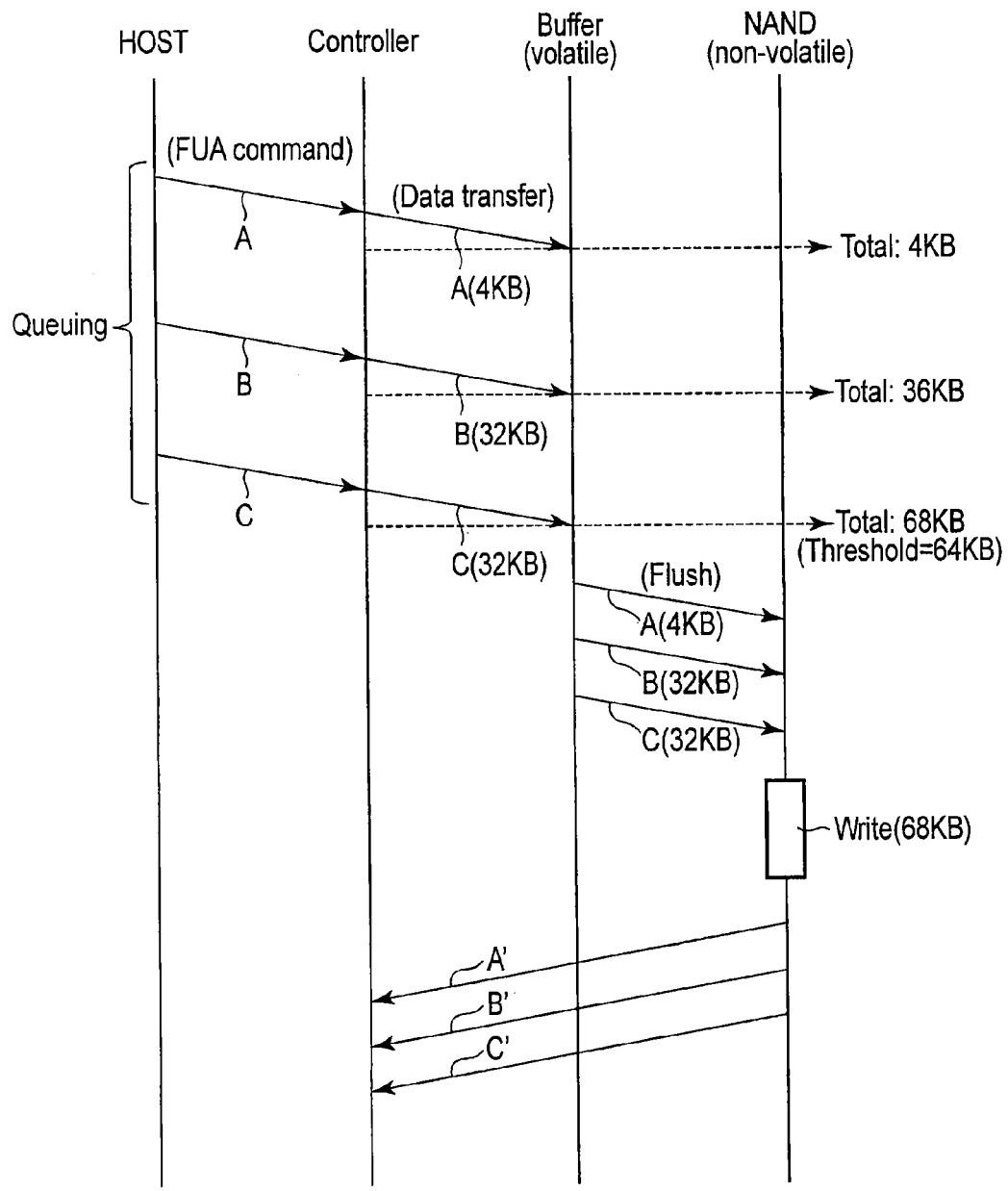
FIG. 10 shows a data transfer flow according to a fifth embodiment.

FIG. 10 shows a data transfer flow according to a fifth embodiment.

The fifth embodiment employs, as the predetermined condition in the basic concept, a feature that the total data size (total data capacity) associated with a plurality of FUA commands in the queuing part exceeds a threshold.

Like the third embodiment, the fifth embodiment can also overcome the problem that a lot of time is required for emergency data saving when an error (such as reduction of a power supply voltage due to power failure) has occurred during batch writing to the nonvolatile memory.

In the fifth embodiment, when the total data size associated with a plurality of FUA commands does not reach a threshold, writing to the nonvolatile memory is interrupted, while when the total data size reaches the threshold, batch writing to the nonvolatile memory is performed.

As described above, by regularly performing writing to the nonvolatile memory, the data size of batch writing can be prevented from being excessively increased, thereby reducing the time required for emergency data saving upon occurrence of an error, and reducing the required battery capacity.

Specifically, firstly, a plurality of commands A, B and C are transferred from the host to the controller. For facilitating the description, it is assumed that the commands A, B and C are all FUA commands. The data associated with the commands A, B and C is temporarily stored in a buffer memory (data transfer).

When writing data of 4 Kbytes associated with the first command A to the buffer memory (buffering) has finished, the data size (4 Kbytes) is measured by a counter (total: 4 KB). Subsequently, when writing data of 32 Kbytes associated with the subsequent command B to the buffer memory has finished, the total data size (36 Kbytes) of the data associated with the commands A and B is measured by a counter (total: 36 KB).

Similarly, when writing data of 32 Kbytes associated with the last command C to the buffer memory has finished, the total data size (68 Kbytes) of the data associated with the commands A, B and C is measured by a counter (total: 68 KB).

In the fifth embodiment, the threshold is set to, for example, 64 Kbytes.

In this case, when the data associated with the command C has been written to the buffer memory, the data of 68 bytes associated with the three commands A, B and C is simultaneously transferred from the buffer memory to the nonvolatile memory (flushing).

Further, after completing the writing of the data associated with the plurality of commands A, B and C to the nonvolatile memory, information items A', B' and C' indicating the completion of writing of the data associated with the commands A, B and C are simultaneously sent from the controller to the host.

As described above, in the fifth embodiment, when a plurality of queuing FUA commands are processed, the data associated with the FUA commands is simultaneously transferred to the nonvolatile memory, on condition that the total data size corresponding to the FUA commands reaches a threshold.

Since in this case, the data associated with a plurality of FUA commands can be simultaneously written, the storage device can assume a busy state at a time, unlike the comparative example. Accordingly, the time required for processing all FUA commands can be shortened, compared to the comparative example. Namely, the busy state of the storage device can be shortened to thereby enhance the performance of the system.

In the fifth embodiment, the commands transferred from the host to the controller may include non-FUA commands that do not guarantee writing to the nonvolatile memory. In this case, the controller has a function of selecting FUA commands from queuing commands.

(6) Sixth Embodiment

FIG. 11 shows a data transfer flow according to a sixth embodiment.

Like the fifth embodiment, the sixth embodiment employs, as the predetermined condition in the basic concept, a feature that the total data size (total data capacity) associated with a plurality of FUA commands in the queuing part exceeds a threshold.

However, the sixth embodiment differs from the fifth embodiment in that in the latter, when a predetermined condition (e.g., threshold=64 KB) is satisfied, all data (of, for example, 68 KB) associated with a plurality of commands is simultaneously transferred to the nonvolatile memory, while in the former, when a predetermined condition (e.g., threshold=64 KB) is satisfied, part (of, for example, 64 KB) of the data associated with a plurality of commands is simultaneously transferred to the nonvolatile memory.

As described above, by limiting the size of the data to be transferred to the nonvolatile memory to a certain value, degradation of the response time of the storage device due to an increase in the time required for writing to the nonvolatile memory can be suppressed.

It is sufficient if the size of the data to be transferred to the nonvolatile memory is smaller than the total size of the data associated with the plurality of commands. For instance, the size of the data to be transferred to the nonvolatile memory may be set equal to the threshold.

Specifically, firstly, a plurality of commands A, B and C are transferred from the host to the controller. For facilitating the description, it is assumed that the commands A, B and C are all FUA commands. The data associated with the commands A, B and C is temporarily stored in a buffer memory (data transfer).

When writing of the data of 4 Kbytes associated with the first command A to the buffer memory (buffering) has finished, the data size (4 Kbytes) is measured by a counter (total: 4 KB). Further, when writing of the data of 32 Kbytes associated with the subsequent command B to the buffer memory has finished, the total data size (36 Kbytes) corresponding to the commands A and B is measured by the counter (total: 36 KB).

Similarly, when writing of the data of 32 Kbytes associated with the last command C to the buffer memory has finished, the total data size (68 Kbytes) corresponding to the commands A, B and C is measured by the counter (total: 68 KB).

In the sixth embodiment, the threshold is set to 64 Kbytes.

In this case, after finishing the writing of the data associated with the command C to the buffer memory, part (64 Kbytes) of the data associated with the commands A, B and C is simultaneously transferred from the buffer memory to the nonvolatile memory (flushing).

After completing the writing of the data associated with the commands A and B to the nonvolatile memory, information items A' and B' indicating that the writing of the data associated with the commands A and B has been completed are simultaneously sent from the controller to the host.

In addition, after completing the writing of part of the data associated with the command C to the nonvolatile memory, information item C' indicating that the writing of part of the data associated with the command C has been completed is sent from the controller to the host. The remaining data associated with the command C is transferred to the nonvolatile memory when the predetermined condition is satisfied in a subsequent occasion.

As described above, in the sixth embodiment, when a plurality of queuing FUA commands are processed, the data associated with the FUA commands is simultaneously transferred to the nonvolatile memory on condition that the number of the FUA commands reaches the threshold.

Since in this case, the data associated with a plurality of FUA commands can be simultaneously written, the storage device can assume a busy state at a time, unlike the comparative example. Accordingly, the time required for processing all FUA commands can be shortened, compared to the comparative example. Namely, the busy state of the storage device can be shortened to thereby enhance the performance of the system.

In the sixth embodiment, the commands transferred from the host to the controller may include non-FUA commands that do not guarantee writing to the nonvolatile memory. In this case, the controller has a function of selecting FUA commands from queuing commands.

(Others)

Although the above-described embodiments employ FUA commands as commands that guarantee writing data to the nonvolatile memory, they may employ commands in which processing is completed when writing of data to a nonvolatile memory is completed, like write commands in a write cache disable mode.

APPLIED EXAMPLE

The above-described embodiments are applicable to the overall storage devices.

Among the storage devices, it is especially effective to apply the embodiments to a product using a NAND flash memory as a storage memory, such as an SSD or a memory card. The SSD includes an enterprise SSD (solid state drive), such as a server, a client SSD, such as a notebook computer, and a near line SSD positioned therebetween.

CONCLUSION

In the embodiments described above, since writing (flushing) of data associated with a plurality of queuing FUA commands to the nonvolatile memory is performed at a time when a predetermined condition is satisfied, the performance of the system can be enhanced.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system connectable to a host, the memory system comprising:
a nonvolatile memory; and
a controller controlling the nonvolatile memory, the controller being configured to:
receive a first write command from the host, the first write command requesting for guaranteeing that a first write data is written to the nonvolatile memory;
queue a second write command being associated with the first write command in a queuing part;
receive a third write command from the host, the third write command requesting for guaranteeing that a second write data is written to the nonvolatile memory;
queue a fourth write command being associated with the third write command in the queuing part;
store the first write data in a buffer memory;
store the second write data in the buffer memory;
transfer the first write data and the second write data in series from the buffer memory to the nonvolatile memory when a predetermined condition is complied with;
send a first reply to the host after receiving a second reply from the nonvolatile memory, the second reply being sent from the nonvolatile memory when the first write data is stored in the nonvolatile memory, the first reply being associated with the second reply, the first reply being a response of the first write command; and
send a third reply to the host after receiving a fourth reply from the nonvolatile memory, the fourth reply being sent from the nonvolatile memory when the second write data is stored in the nonvolatile memory, the third reply being associated with the fourth reply, the third reply being a response of the third write command.

2. The system of claim 1,
wherein the predetermined condition is that both the first and second write data is stored in the buffer memory.

3. The system of claim 2,
wherein the first and second write commands are deleted from the queuing part when both the first and second write data are stored in the buffer memory.

4. The system of claim 3,
wherein the first and second write data are not transferred to the nonvolatile memory before both the first and second write data are stored in the buffer memory.

5. The system of claim 3,
wherein the predetermined condition is that a fixed period elapses after the second and fourth write commands are deleted from the queuing part, in a case where a new command is not queued in the queuing part in the fixed period.

6. The system of claim 5, comprising:
a timer configured to measure the fixed period.

7. The system of claim 3,
wherein the predetermined condition is that a fixed period elapses after the second and fourth write commands are deleted from the queuing part, in a case where a new command may be queued in the queuing part in the fixed period.

8. The system of claim 1,
wherein the buffer memory is a static random access memory (SRAM).

9. The system of claim 1,
wherein the predetermined condition is that a number of commands including the second and fourth write commands are larger than a threshold value.

10. The system of claim 1,
wherein the predetermined condition is that a total size of data associated with commands including the second and fourth write commands is larger than a threshold value.

11. A memory system connectable to a host, the memory system comprising:
a nonvolatile memory;
a buffer memory; and
a controller controlling the nonvolatile memory and the buffer memory, the controller being configured to:
receive a first write command from the host, the first write command requesting for guaranteeing that a first write data is written to the nonvolatile memory;
queue a second write command being associated with the first write command in a queuing part;

receive a third write command from the host, the third write command requesting for guaranteeing that a second write data is written to the nonvolatile memory;

queue a fourth write command being associated with the third write command in the queuing part;

store the first write data in the buffer memory;

store the second write data in the buffer memory;

transfer the first write data and the second write data in series from the buffer memory to the nonvolatile memory when a predetermined condition is complied with;

send a first reply to the host after receiving a second reply from the nonvolatile memory, the second reply being sent from the nonvolatile memory when the first write data is stored in the nonvolatile memory, the first reply being associated with the second reply, the first reply being a response of the first write command; and send a third reply to the host after receiving a fourth reply from the nonvolatile memory, the fourth reply being sent from the nonvolatile memory when the second write data is stored in the nonvolatile memory, the third reply being associated with the fourth reply, the third reply being a response of the third write command.

12. The system of claim 11,
wherein the predetermined condition is that both the first and second write data are stored in the buffer memory.

13. The system of claim 12,
wherein the first and second write commands are deleted from the queuing part when both the first and second write data are stored in the buffer memory.

14. The system of claim 13,
wherein the first and second write data are not transferred to the nonvolatile memory before both the first and second write data are stored in the buffer memory.

15. The system of claim 13,
wherein the predetermined condition is that a fixed period elapses after the second and fourth write commands are deleted from the queuing part, in a case where a new command is not queued in the queuing part in the fixed period.

16. The system of claim 15, comprising:
a timer configured to measure the fixed period.

17. The system of claim 13,
wherein the predetermined condition is that a fixed period elapses after the second and fourth write commands are deleted from the queuing part, in a case where a new command may be queued in the queuing part in the fixed period.

18. The system of claim 11,
wherein the buffer memory is a dynamic random access memory (DRAM).

19. The system of claim 11,
wherein the predetermined condition is that a number of commands including the second and fourth write commands are larger than a threshold value.

20. The system of claim 11,
wherein the predetermined condition is that a total size of data associated with commands including the second and fourth write commands is larger than a threshold value.

* * * * *